United States Patent [19]
Bell

[11] Patent Number: 6,101,376
[45] Date of Patent: Aug. 8, 2000

[54] SQUELCH CIRCUIT AND METHODOLOGY FOR A MULTI-LEVEL QUANTIZER

[75] Inventor: Russell Bell, Austin, Tex.

[73] Assignee: Advanced Micro Devices, Inc., Sunnyvale, Calif.

[21] Appl. No.: 08/964,857

[22] Filed: Nov. 5, 1997

[51] Int. Cl.[7] .................................. H04B 1/10; H04L 7/02
[52] U.S. Cl. .......................... 455/218; 455/219; 455/225; 455/242.2; 375/260; 375/264; 330/310; 330/311; 341/126; 341/158; 341/159; 348/405
[58] Field of Search ..................................... 455/218, 219, 455/220, 222, 225, 242.2, 253.2, 303, 304; 375/260, 264, 286, 287; 330/310, 311, 295; 378/405; 341/126, 158, 159

[56] References Cited

U.S. PATENT DOCUMENTS

| | | | |
|---|---|---|---|
| 4,630,290 | 12/1986 | Kage | 455/218 |
| 5,303,407 | 4/1994 | Juergensen et al. | 455/218 |
| 5,367,162 | 11/1994 | Holland et al. | 250/287 |
| 5,450,622 | 9/1995 | Vandegraaf | 455/222 |
| 5,481,226 | 1/1996 | Parkes, Jr. | 330/311 |
| 5,517,433 | 5/1996 | Morrison | 375/286 |

*Primary Examiner*—Fan S. Tsang
*Assistant Examiner*—Simon Nguyen

[57] ABSTRACT

An improved squelch circuit and methodology for a multi-level quantizer employing one or more amplifiers to amplify an input signal at different gains. Comparators coupled to corresponding amplifiers or amplifier stages produce pulses based on comparing the amplified signals with a common reference potential. Digital delay lines coupled to the comparators repeatedly delay the pulses.

28 Claims, 8 Drawing Sheets

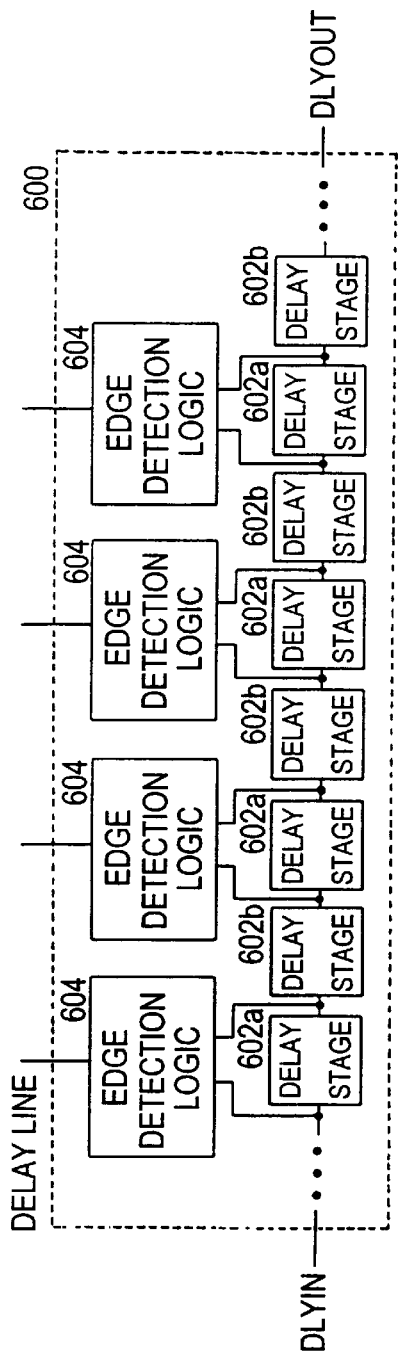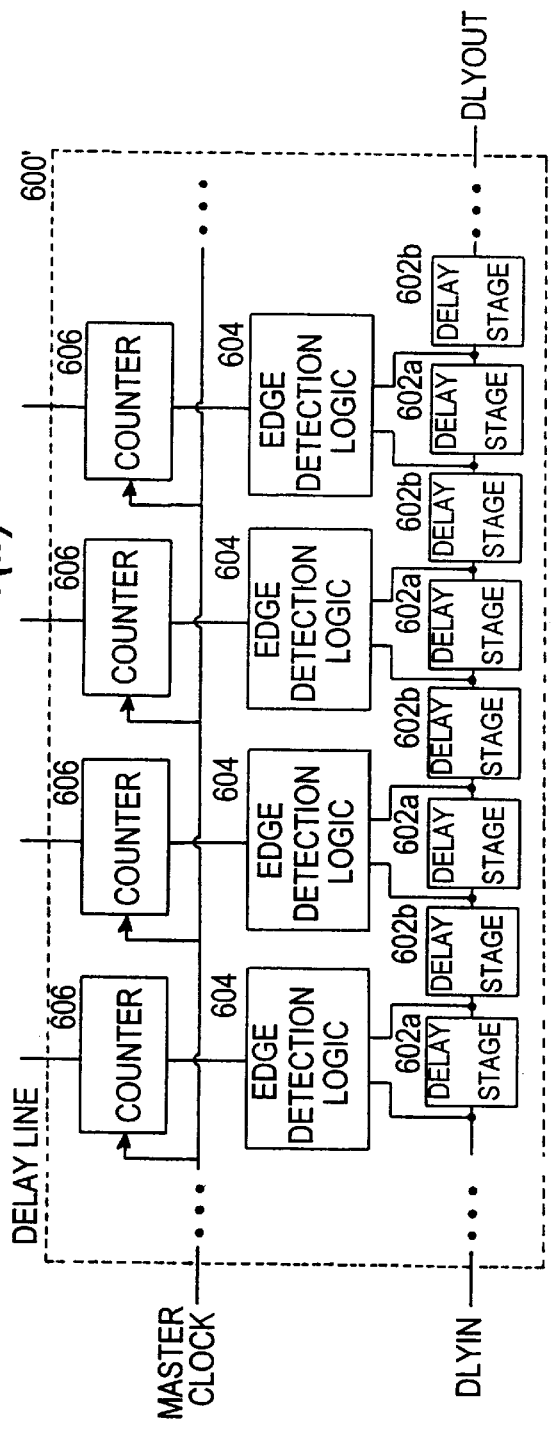

SQUELCH CIRCUIT AND METHODOLOGY FOR A MULTI-LEVEL QUANTIZER

TECHNICAL FIELD

The present invention relates to signal processing and, more particularly, to novel signal squelching using delay line technology.

BACKGROUND ART

Squelch circuits are used to preclude lower level or noisy signals from entering a communications processing circuit or system. A familiar example is a hand-held transceiver radio, e.g. a walkie-talkie or CB radio. Without squelch circuits, these systems would generate a rather annoying hissing sound when no signal is received. With squelch control, input signals are passed to the speaker only when the input signal exceeds a prescribed level. In some implementations, the squelch level is adjustable, for example, by a person manipulating a potentiometer configured to provide a reference potential for squelching.

In the related, commonly assigned, U.S. patent application Ser. No. 08/974,672, entitled "Signal Detection Circuit and Methodology" filed on Nov. 19, 1997, I describe an improved multi-level quantizer using delay line techniques. Therein, delay lines capture and buffer timing information for those portions of an analog input signal that are at or above certain amplitude levels, determined by comparing the input signal with a corresponding reference potential from a voltage divider network. Therefore, certain amplitude levels of the input signal are precluded, i.e. squelched, from entering a delay line, thus directing various amplitude signals into appropriate delay lines.

Referring to FIG. 1, a multi-level quantizer 100, described in the related application, provides a snapshot of both amplitude and timing (e.g. phase or frequency) information of an input signal, received at node $V_{in}$. Appropriate pattern detection logic 140 may be used to demodulate or detect the input signal based on the snapshot provided by the multi-level quantizer 100.

In this circuit, an input signal is received at node $V_{in}$ and applied to a plurality of comparators 122, 124, 126, and 128 for comparison with a respective, different reference potential received from a voltage divider 110. Voltage divider 110 is a chain of resistive elements 112, 114, 116, 118, and 120, e.g. resistors, coupled in series from a source of a reference supply potential $V_{ref}$, e.g. a system supply potential $V_{cc}$, to a source of ground potential. If the voltage drops across resistive elements 112–120 are equal in the illustrated configuration, then the highest reference potential is four-fifths of the reference supply potential and the lowest reference potential is one-fifth of the reference supply potential. For example, with a reference supply potential of 5 V, the reference potential supplied to comparator 128 is 1 V.

The output of each comparator 122–128 is coupled to the input of a respective delay line 132–138 for repeatedly delaying an output pulse of each comparator for a common delay period. In this manner, the comparators 122–128 quantize the amplitude information of an input signal according to a reference potential by generating a pulse based on a comparison of the input signal and the respective reference potential. The delay lines 132–138 buffer and hence capture the timing information of the pulses from the comparators 122–128. Thus, pattern matching logic 140 coupled to the delay lines 132–138 is able to synoptically inspect an analog signal that is quantized into pulses and buffered for signal detection or demodulation.

In some operating environments, however, it may be disadvantageous to use a voltage divider for providing the plurality of reference voltages. For example, when the squelch level is lowered, the lowest reference voltage, a fraction of the reference supply potential $V_{ref}$, may be brought down to a level that causes difficulties in the multi-level quantizer 100. For example, a comparator may have a threshold voltage of 0.7 V, below which signals cannot be compared. Consequently, amplitudes in the input below the threshold voltage are not detected by the quantizer. Thus, the normally negligible theshold voltage of a comparator becomes a constraint limiting the range of squelching levels. Moreover, comparators using a low reference potential generated by the voltage divider 110 may be more susceptible to noise.

In low power situations, a voltage divider may consume more power than desirable, because it provides an electrical conduction path that is always conducting between sources of supply and ground potential. In another example, it may be difficult to manufacture resistors or other large-lumped resistive elements of the appropriate precision in some implementations, e.g. on monolithic semiconductor substrates with highly miniaturized components.

DISCLOSURE OF THE INVENTION

There exists a need for a squelching circuit with an increased range in squelching levels, especially at the lower end of the range. There is a also need for a squelching circuit that has reduced power consumption and improved noise resistance. There further exists a need for a squelching circuit that does not use large-lumped resistors or a voltage divider network.

These and other needs are met by the present invention in which one or more amplifiers amplify an input signal at different gains to allow prescribed amplitude levels in the input signal to be compared with a common reference potential. By this arrangement, the common reference potential may be supplied, e.g. from a a power supply source, without requiring a voltage divider network and its attendant disavantages. Moreover, since input signals can be amplified up to the common reference potential above a comparator's threshold voltage, the squelching range at the lower end can be extended.

Accordingly, one aspect of the invention is a multi-level quantizer with improved squelching, comprising plural amplifiers for amplifying an input signal. Comparators are coupled to corresponding amplifiers for producing pulses based on comparing the amplified signals and a common reference potential. Digital delay lines are coupled to corresponding comparators for delaying the pulses.

Optionally, the amplifiers may include cascaded amplifier stages. These amplifier stages may have gains greater than unity. In an alternative implementation, the amplifier stages have a common gain. In another implementation, the gains of amplifier stages increase through the cascade. The digital delay lines may include edge detection logic for detecting edges in the pulses.

Alternatively, a multi-level quantizer with improved squelching comprises an amplifier including cascaded amplifier stages, which are coupled to corresponding comparators for producing pulses based on comparisons between the amplified signals and a common reference potential. Digital delay lines are coupled to corresponding comparators for delaying the pulses.

Additional objects, advantages, and novel features of the present invention will be set forth in part in the detailed description which follows, and in part will become apparent upon examination or may be learned by practice of the invention. The objects and advantages of the invention may be realized and obtained by means of the instrumentalities and combinations particularly pointed out in the appended claims.

BRIEF DESCRIPTION OF DRAWINGS

The present invention is illustrated by way of example, and not by limitation, in the figures of the accompanying drawings, wherein elements having the same reference numeral designations represent like elements throughout and wherein:

FIG. 6 (a) is a block diagram of a delay line that may be used to implement the circuit depicted in FIGS. 2 and 5.

FIG. 6 (b) is a block diagram of another delay line that may be used to implement the circuits depicted in FIGS. 2 and 5.

BEST MODE FOR CARRYING OUT THE INVENTION

A circuit and method for squelching a signal are described. In the following description, for purposes of explanation, numerous specific details are set forth in order to provide a thorough understanding of the present invention. It will be apparent, however, that the present invention may be practiced without these specific details. In other instances, well-known structures and devices are shown in block diagram form in order to avoid unnecessarily obscuring the present invention.

SQUELCHING WITH AMPLIFIERS

Figure 1:
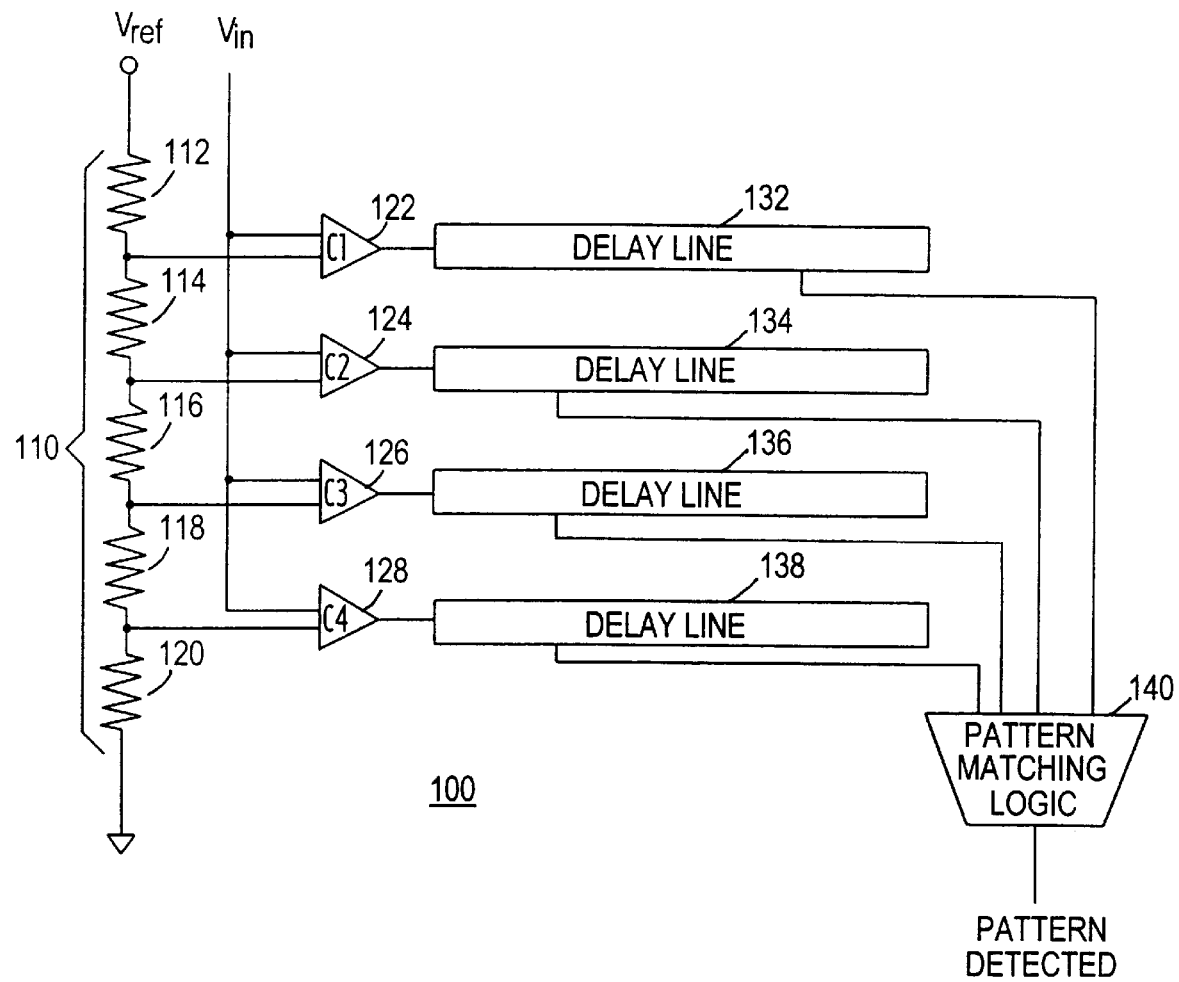
FIG. 1 is a circuit diagram of a multi-level quantizer described in a related application.
Figure 2:
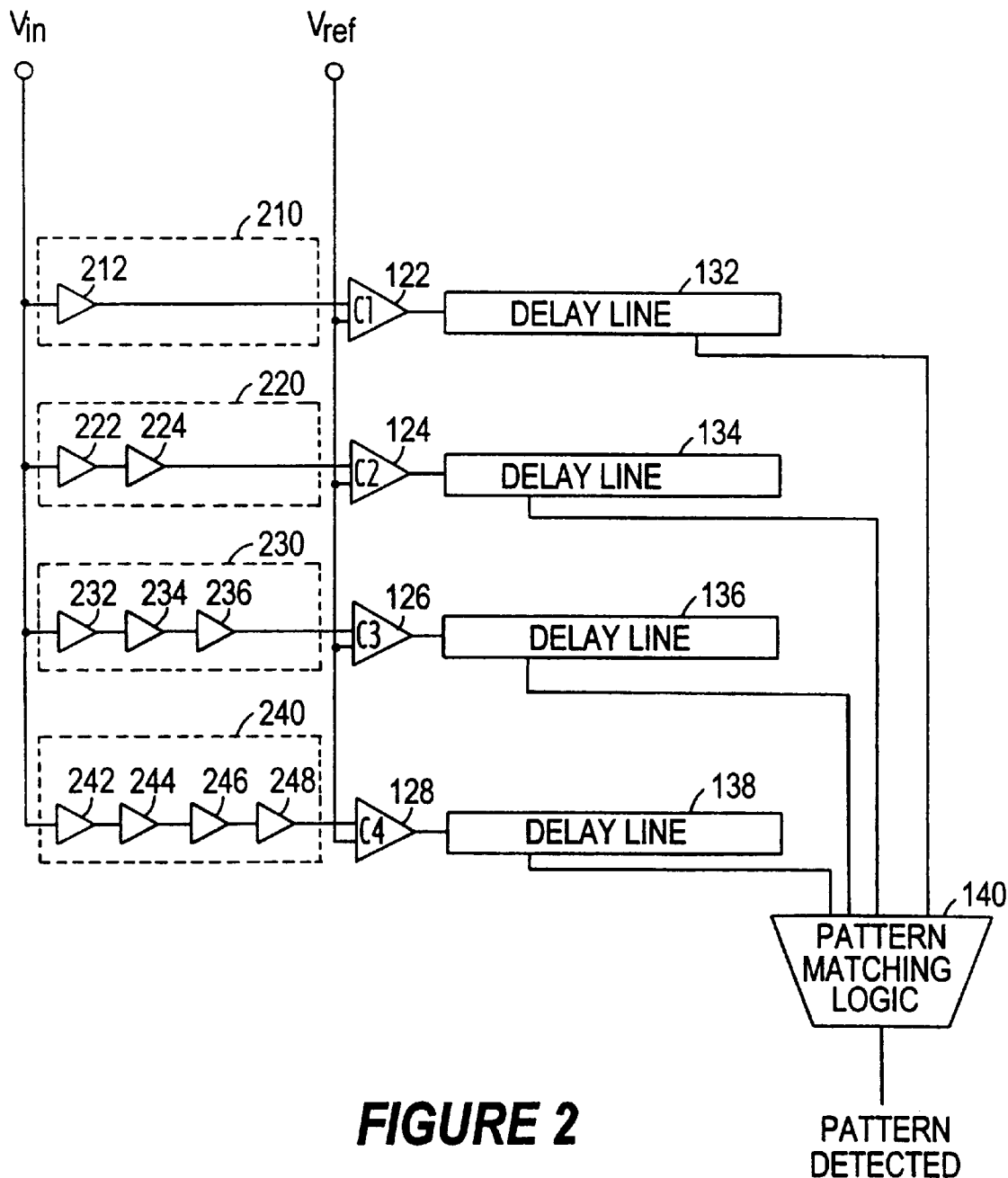
FIG. 2 is a circuit diagram of a multi-level quantizer with improved squelching according to one embodiment of the present invention.
Figure 3A:
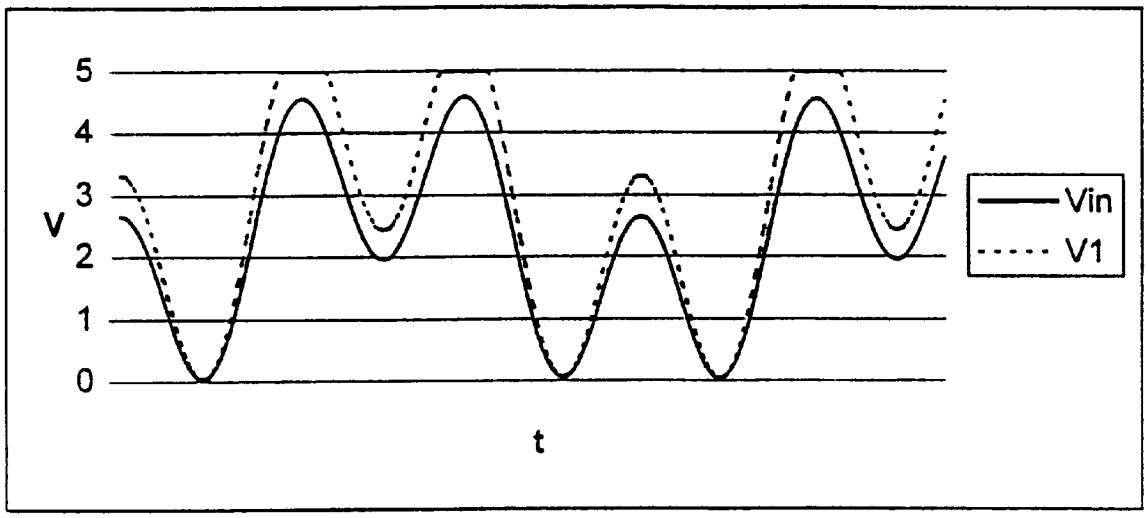
FIGS. 3(a) to 3(d) are graphs illustrating amplified outputs in an exemplary operation of one embodiment of the present invention.
Figure 3B:
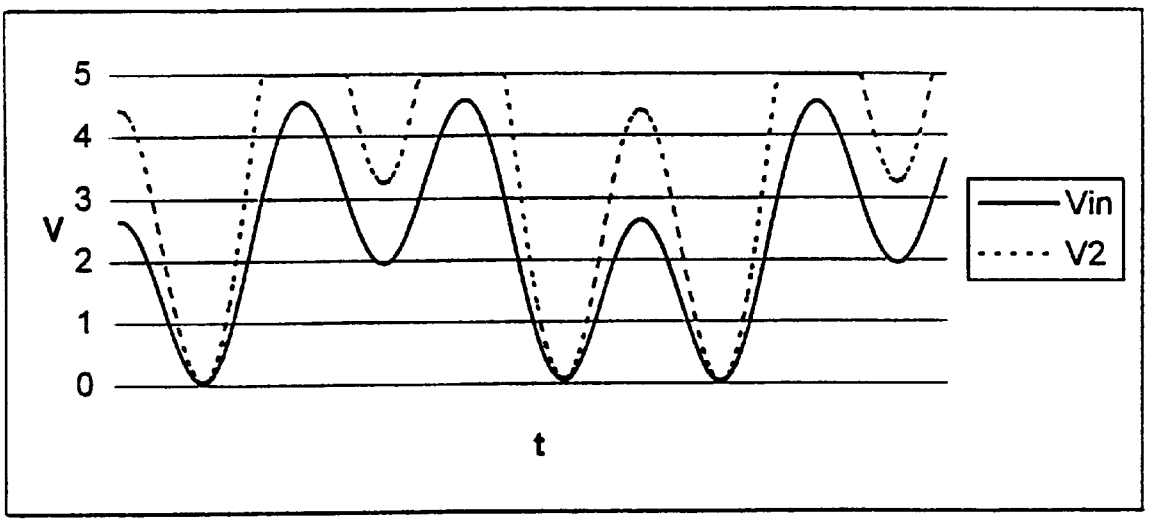
Figure 3C:
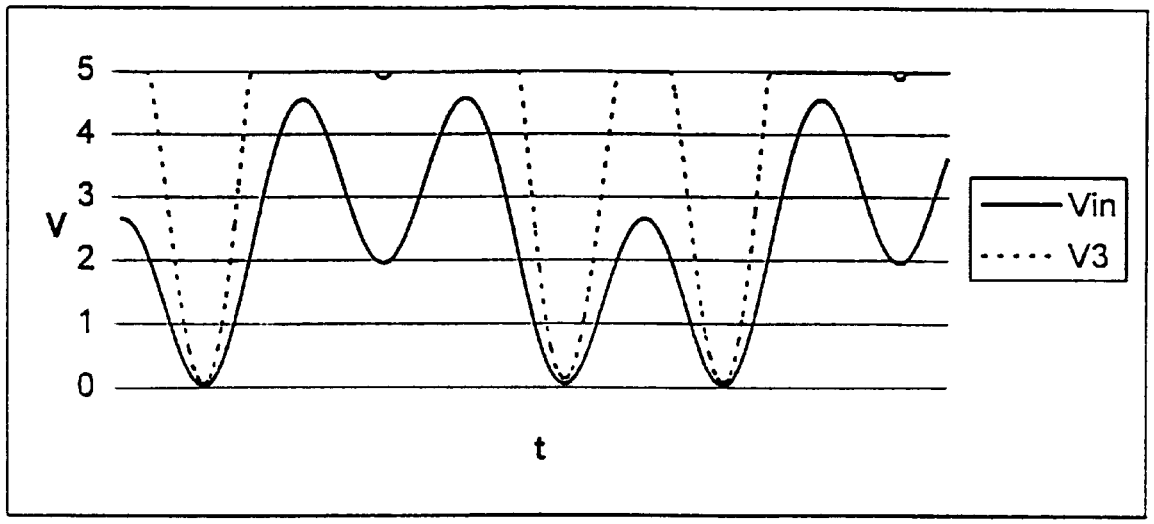
Figure 3D:
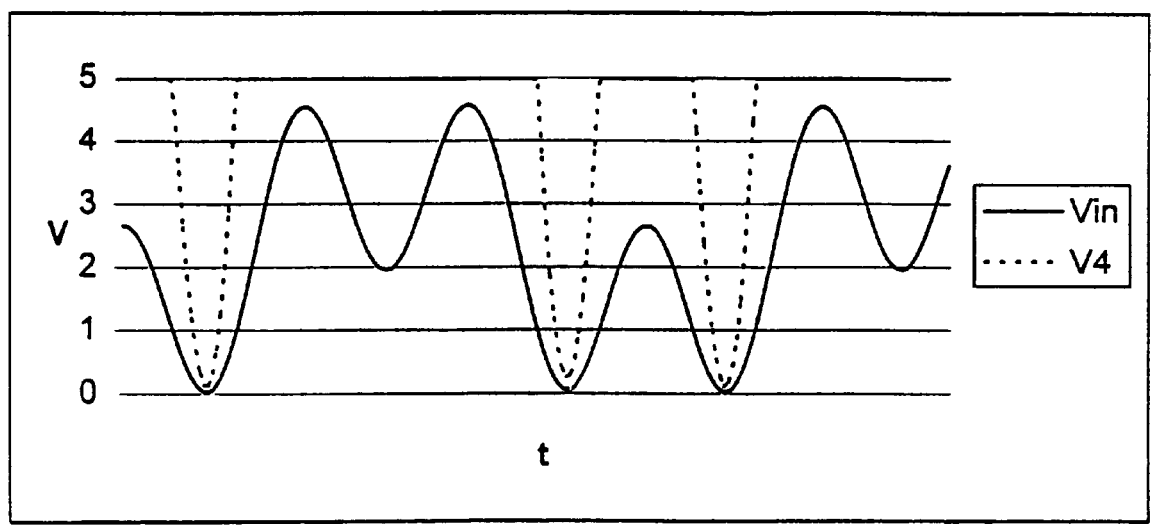

Referring to FIG. 2, one embodiment of the present invention employs amplifiers 210, 220, 230, and 240, each receiving an input signal via node $V_{in}$, amplifying the signal, and applying the amplified signal to a corresponding comparator 122, 124, 126, and 128, respectively. Although FIG. 2 depicts the use of four (4) amplifiers 210–240 and four (4) corresponding comparators 122–128, the particular number of amplifiers and comparators employed will vary from implementation to implementation, depending on how much precision in the amplitude domain or how many amplitude levels are desired in a particular implementation environment. In fact, if the input signal does not bear encoded information in the amplitude of the signal, as is true for frequency modulation, then only a single amplifier and comparator combination need be used.

Each comparator 122–128 is coupled to a common source of a reference potential $V_{ref}$. Accordingly, each comparator 122–128 is configured to compare the corresponding, applied amplified signal to the common reference potential. In response, each comparator 122–128 produces a pulse based on a comparison of the applied amplified signal and the common reference potential and applies the pulse to a corresponding digital delay line 132, 134, 136, and 138, respectively.

Each amplifier 210–240 is configured to amplify the input signal at a different gain. In one embodiment, each amplifier comprises a single amplifier stage having a respective specified gain. For example, amplifier 210 may be configured to amplify the input signal at a gain of 1.25, amplifier 220 at a gain of 1.67, amplifier 230 at a gain of 2.5, and amplifier 240 at a gain of 5.0.

In another embodiment, each amplifier 210–240 may comprise one or more cascaded amplifier stages, i.e., stages coupled in series. For example in FIG. 2, amplifier 210 may comprise a single amplifier stage 212. Amplifier 220 may include amplifiers stages 222 and 224. Amplifiers 220 and 230 may be implemented with three amplifier stages 232, 234, and 236 and four amplifier stages 242, 244, 246, and 248, respectively. Thus, the amplifiers 210–240 in the configuration depicted in FIG. 2 are arranged to have a net gain of 1.25, 1.67, 2.5, and 5, for detecting amplitudes of 4 V, 3 V, 2 V, and 1 V based on a 5 V reference voltage, respectively. Accordingly, amplifier stages 212, 222, 232, and 242 may be implemented with a gain of 1.25; amplifier stages 224, 234, and 244 with a gain of 1.33; amplifier stages 236 and 246 with a gain of 1.5; and amplifier stage 248 with a gain of 2. Thus, the net gain of amplifier 220 is the product of the gain of amplifier stage 222 (i.e. 1.25) and amplifier stage 224 (i.e. 1.33), which is about 1.67. Similarly, the net gain of amplifier 230 is the product of the gain of amplifier stage 232 (i.e. 1.25), amplifier stage 234 (i.e. 1.33) and amplifier 236 (i.e. 1.5), which together represent a 2.5 net gain. In this configuration, the gain of a subsequent amplifier stage is greater than the gain of a preceding amplifier stage, although other arrangements, e.g. from higher gain to lower gain or random, may be implemented.

Accordingly, an input signal at 4 V is amplified to 5 V by amplifier 210, to 6.7 V by amplifier 220, to 10 V by amplifier 230, and to 20 V by amplifier 240. However, the output of each amplifier will peak (become clipped) at the supply voltage, e.g. 5 V, so that in this case an input signal of 4 V and higher would cause all amplifiers 210–240 to clip at 5 V. Referring to the graph shown in FIG. 3 (a), illustrated is an exemplary input signal Vin and an amplified signal output V1 of amplifier 210 with a gain of 1.25. Portions of the input signal having an amplitude of 4 V and higher are amplified and clipped at 5 V, the common supply voltage; however, the other portions of the input signal with an amplitude less than 4 V are not amplified to the 5 V level.

Referring to FIG. 3 (b), only those portions of the input signal which exceed 3 V cause amplifier 220 with a gain of 1.67 to output a clipped, amplified signal V2 at 5 V. For amplifier 230 having a gain of 2.5, only those portions of the input signal in excess of 2 V are output at 5 V, as illustrated for V3 in FIG. 3(c). Finally, in FIG. 3(d), amplifier 240 with a gain of 5, outputs a clipped signal V4 only for those portions of the input signal exceeding 1 V.

Therefore, comparators 122–128 need only compare the corresponding amplified and clipped signals with a common reference potential for producing the pulses based on the comparison. For example, the common reference potential may be the supply voltage, e.g. $V_{cc}$. Consequently, even for an implementation using a plurality of comparators, only one reference potential needs to be supplied to the comparators, avoiding the necessity for a voltage divider or other circuitry for providing multiple reference potentials, e.g. those using large-lumped components. By avoiding use of a voltage divider network, power consumption can be reduced because there is no conduction path between source and ground that is always biased.

Figure 4:
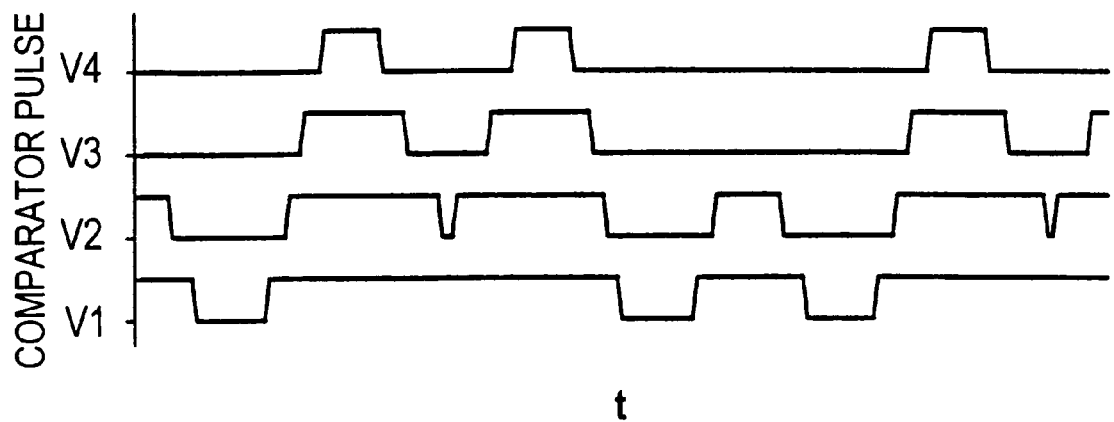
FIG. 4 is a graph illustrating pulses produced by comparators in the exemplary operation of FIG. 3.

The comparators 122–128 may be configured to output a pulse as long as the amplified signal is about 5 V, or above 5 V if the amplifiers 210–240 are not configured to clip. Based on the exemplary input signal and generated amplified signals shown in FIGS. 3(*a*)–3(*d*), the comparators 122–128 output pulses as illustrated in FIG. 4. These pulses are repeatedly delayed by a common delay period in the delay lines 132–138, as explained in more detail hereinafter.

Figure 5:
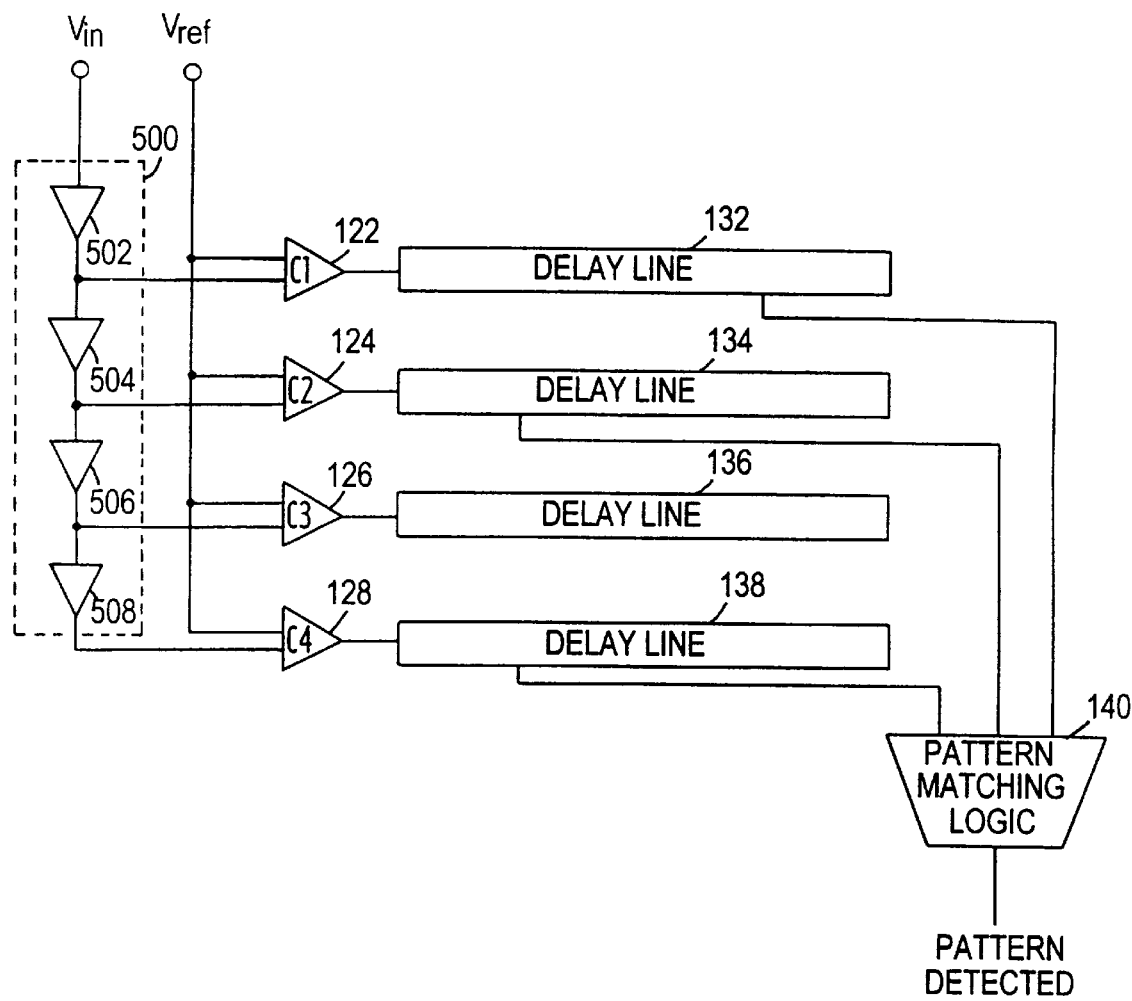
FIG. 5 is a circuit diagram of a multi-level quantizer with improved squelching according to another embodiment of the present invention.

In FIG. 5, assuming a reference potential at or slightly below 5 V, e.g. 4.9 V or 4.95 V, an amplified signal that is cut off at 5 V will result in a logical high output (e.g. 5 V) by the comparator. Conversely, an amplified signal at an amplitude below the reference potential will result in a logical low output (e.g. 0 V) by the comparator. Alternatively, the comparators 122–128 may be configured to output a brief pulse when the amplified signal reaches approximately the reference potential, or above the reference potential if the amplifiers 210–240 are not configured to clip.

To detect amplitude levels in the input signal lower than the threshold voltage of a comparator, the input signal can be amplified so that the amplified level is greater than the threshold voltage. For example, even if the threshold voltage of a comparator is 0.7 V, an input signal with an amplitude lower than the threshold voltage, e.g. 0.5 V, is amplified and compared at a level the comparator can handle.

In another example, the gains of all the amplifier stages can be common. For example, if the gain of all the amplifier stages is 1.5, then the gain of amplifier 210 with a single amplifier stage 212 is 1.5, which allows input amplitudes of 3.3 V and higher to trigger a pulse from the corresponding comparator 122 based on a reference voltage of 5 V. Amplifier 220 with two amplifier stages 222 and 224 will have a net gain of $(1.5)^2 = 2.3$ for detecting input amplitudes of 2.2 V and higher. Likewise, amplifiers 230 and 240 with three and four amplifier stages will have net gains of 3.4 and 5.0, for detecting input amplitudes of 1.5 V and 1.0 V, respectively. Amplifiers stages with the same gain enable the design and manufacturing costs to be reduced, because only one kind of amplifier stage is used and can be repeated.

When all the amplifier stages have a common gain, an amplifier stage from each amplifier can be omitted by choosing a common reference potential that is the quotient of a desired reference potential and the common gain. In the example, amplifiers 212, 224, 236, and 248 can be removed from the implementation if the reference voltage is reduced to 3.3 V (the 5 V supply voltage divided by 1.5).

In both these examples, the first amplifier stages 212, 222, 232, and 234 of corresponding amplifiers 210–240 have the same gain, namely, 1.25 or 1.5 for the respective examples. Likewise, the second amplifier stages 224, 234, and 244 have the same gain of 1.67 or 1.5 in either example. Thus, it is evident that since the first amplifier stages amplify the same signal by the same gain, their functions can be subsumed into a single amplifier. The functions of the second and third amplifier stages can similarly be combined into a respective amplifier stage.

Referring to FIG. 5, depicted is an embodiment of the present invention, in which the several parallel amplifier stages are coalesced into a single, coordinate amplifier stage. Specifically, amplifier 500 comprises a chain of cascaded amplifier stages 502, 504, 506, and 508, the respective outputs of which are coupled to comparators 122, 124, 126, and 128. To detect the input amplitudes of 4 V, 3 V, 2 V, and 1 V as in the first example above, amplifier stage 502 will have a gain of 1.25, amplifier stage 504 a gain of 1.33, amplifier stage 506 a gain of 1.5, and amplifier stage 508 a gain of 2. In the other example, amplifier stages 502–508 have the same gain, e.g. 1.5. The remainder of the circuit, viz. the delay lines and the pattern matching logic, is configured and operates in a manner similar to that of the circuit depicted in FIG. 2.

DELAY LINE

With reference to FIG. 6(*a*), a delay line 600 that can be used to implement delay lines 132–138 comprises a chain of serially coupled delay stages 602*a* and 602*b* for repeatedly delaying a signal applied to the delay line 600. Typically, the delay line will comprise tens of thousands, or more, of these delay stages 602. Coupled to an input and output of at least some of the delay stages 602*a*, for example after every other delay stage 602*a*, is edge detection logic 604 for detecting the presence of a recurring signal characteristic, preferably an edge, such as a rising edge or a falling edge in a pulse travelling down the delay line 600. As shown in FIG. 6(*b*), a delay line 600' may further include a counter 606 coupled to the edge detection logic for counting the number of detected edges in the pulses according to a master clock signal so that histograms may be generated to compensate for noise in the signal, such as jitter effects.

Each delay stage 602*a* and 602*b* may be a non-inverting delay stage or an inverting delay stage. A non-inverting delay stage provides an output signal that is approximately the same as the input signal, except with phase shifted by a delay period. According to one implementation, a non-inverting delay stage 700 comprises two conventional inverters coupled in series. In another implementation, depicted in FIG. 7(*a*), a non-inverting delay stage 700 comprises two inverting delay stages 702-1 and 702-2, depicted in FIG. 7(*b*), coupled in series.

The delay characteristics of any digital circuit will vary from chip to chip and over time because of unavoidable variations in manufacturing and operating conditions. Preferably, the delay period of each constituent inverting delay stage 702-1 and 702-2 can be synchronized according to a calibration signal as explained with reference to the inverting delay stage 710 depicted in FIG. 7(*b*).

Figure 7A:
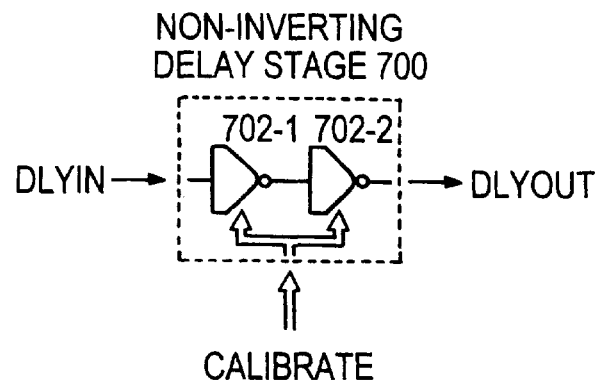
FIGS. 7(a) and 7(b) are circuit diagrams of a non-inverting delay stage and inverting delay stage, respectively, that may be used to implement a delay stages depicted in FIGS. 6(a) and 6(b).
Figure 7B:
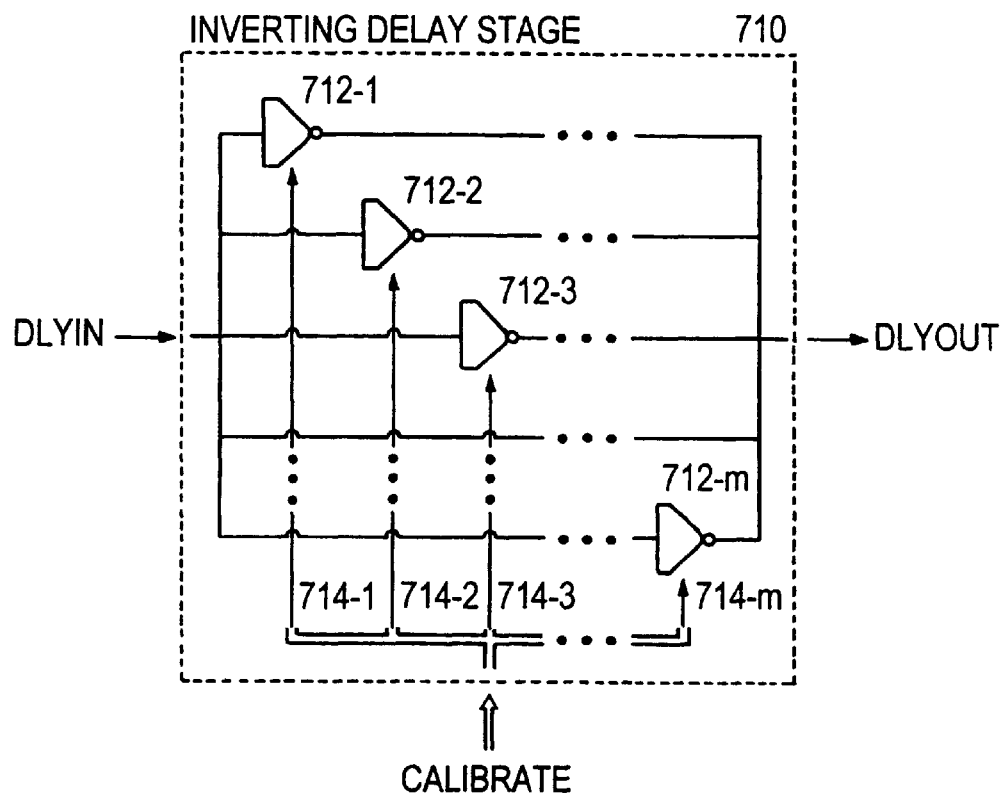

In FIG. 7(*b*) depicted is an adjustable, inverting delay stage 710 according to one implementation comprising a plurality of switchable inverters 712-1, 712-2, 712-3, to 712-m, which may be enabled or disabled according to a corresponding bit 714-1, 714-2, 714-3, to 714-m in a calibration signal. Enabling or disabling a switchable inverter 712 changes the amount of driving power the inverting delay stage 710 can supply to a load capacitance (not shown) and hence affects the delay time of the inverting delay stage 710. Examples of switchable inverters are described in the commonly assigned U.S. Pat. No. 5,220,216 issued to Woo on Jun. 15, 1993 and U.S. Pat. No. 5,227,679 issued to Woo on Jul. 13, 1993.

The calibration signal may be produced with reference to a reliable, precise clock signal, e.g. from a crystal oscillator, preferably by an on-chip digital servo circuit (not shown)

such as described in the commonly assigned U.S. Pat. No. 5,457,719, issued to Guo et al. on Oct. 10, 1995. Briefly, the on-chip digital servo circuit comprises an adjustable digital delay line of its own, which it monitors and continually adjusts with a calibration signal in a feedback loop.

Thus, delay line 600 comprises a series of delay stages 602a and 602b, each of which provides a uniform delay period preferably synchronized to a reference clock period according to a calibration signal. Moreover, each inverting delay stage 710 can have a consistent delay period of as little as 70 ps. Thus, each pair delay stage 602a and 602b or each non-inverting delay stage 700 can have a consistent delay period of as little of 140 ps. Therefore, delay line 600 is high-speed, capable of processing pulses at data rates up to about 7 GHz. Furthermore, digital delay line 600 provides edge detection logic 604 for viewing synoptically any portion of a quantized input signal.

Accordingly, squelching circuitry has been described in which a input signal is amplified and compared with a reference potential greater than a comparator's threshold voltage, hence extending the lower range of the squelch level and reducing the noise susceptibility of the comparator. Furthermore, the use of a common reference potential supplied to comparators does not require the implementation of a voltage divider network or other components difficult to manufacture on a semiconductor substrate.

While this invention has been described in connection with what is presently considered to be the most practical and preferred embodiment, it is to be understood that the invention is not limited to the disclosed embodiment, but, on the contrary, is intended to cover various modifications and equivalent arrangements included within the spirit and scope of the appended claims.

What is claimed is:

1. A multi-level quantizer with improved squelching, comprising:
   a plurality of amplifiers responsive to a common input signal and configured to produce a plurality of respective amplified signals and clip the amplified signals to be at or below a supply voltage;
   a plurality of comparators coupled to the amplifiers for comparing the amplified signals with a common reference potential and producing pulses only when the amplified signals are at or above the reference potential, said reference potential being set to approximately the supply voltage; and
   a plurality of digital delay lines coupled respectively to the comparators for delaying the pulses.

2. The circuit of claim 1, wherein each of the amplifiers has a gain different from that of the other.

3. A multilevel quantizer with improved squelching, comprising:
   a plurality of amplifiers responsive to a common input signal, wherein one of the amplifiers includes a plurality of cascaded amplifier stages;
   a plurality of comparators coupled to the amplifiers for comparing the amplified signals with a common reference potential and producing pulses only when the amplified signals are at or above the reference potential; and
   a plurality of digital delay lines coupled respectively to the comparators for delaying the pulses.

4. The circuit of claim 3, wherein the cascaded amplifier stages are of equal gain.

5. The circuit of claim 3, wherein the gain of one of the cascaded amplifier stages is greater than that of a subsequent cascaded amplifier stage.

6. The circuit of claim 3, wherein the gain of each of the cascaded amplifier stages is greater than unity.

7. The circuit of claim 3, wherein the reference potential is equal to the quotient of a power supply voltage and the gain of one of the cascaded amplifier stages.

8. The circuit of claim 3, wherein the reference potential is approximately equal to a power supply voltage.

9. The circuit of claim 1, wherein the digital delay line includes edge detection logic for generating signals indicative of detected edges in the pulse.

10. A multi-level quantizer with improved squelching, comprising:
    an amplifier responsive to an input signal including cascaded amplifier stages for successively amplifying the input signal;
    a plurality of comparators coupled to the amplifier stages for comparing the amplified signals with a reference potential and producing pulses only when the amplified signals exceed the reference potential; and
    a plurality of digital delay lines coupled to the comparators, for delaying the corresponding pulses.

11. The circuit of claim 10, wherein the cascaded amplifier stages have equal gain.

12. The circuit of claim 10, wherein the gain of one of the cascaded amplifier stages is greater than the gain of a subsequent cascaded amplifier stage.

13. The circuit of claim 10, wherein the gain of each of the cascaded amplifier stages is greater than unity.

14. The circuit of claim 10, wherein the reference potential is equal to the quotient of a power supply voltage and the gain of one of the cascaded amplifier stages.

15. The circuit of claim 10, wherein the reference potential is approximately equal to a power supply voltage.

16. The circuit of claim 10, wherein the digital delay line includes edge detection logic for generating signals indicative of detected edges in the pulse.

17. A method of quantizing a signal with improved squelching, comprising the steps of:
    amplifying the signal to produce therefrom a plurality of amplified signals;
    clipping the amplified signals to be at or below a supply voltage;
    comparing the amplified signals to a common reference potential, said common reference potential being set approximately to the supply voltage;
    producing pulses only when the amplified signals are at or below the common reference potential; and
    repeatedly delaying the corresponding pulses by a common delay period.

18. The method of claim 17, wherein the step of amplifying the signal includes the step of amplifying the signal at a plurality of different gains to produce therefrom the amplified signals.

19. A method of quantizing a signal with improved squelching, comprising the steps of:
    amplifying the signal at a plurality of different gains to produce therefrom a plurality of amplified signals in a plurality of amplification stages;
    comparing the amplified signals to a common reference potential;
    producing pulses only when the amplified signals are at or above the common reference potential; and
    repeatedly delaying the corresponding pulses by a common delay period.

20. The method of claim 19, wherein the step of amplifying the signal in a plurality of amplification stages includes the step of amplifying the signals in the plurality amplification stages at a common gain.

21. The method of claim 19, wherein the step of amplifying the signal in a plurality of amplification stages includes the step of amplifying the signals in the plurality of amplification stages with the gain greater than unity.

22. A method of quantizing a signal with improved squelching, comprising the steps of:

concurrently amplifying the signal at a plurality of different corresponding gains to produce therefrom a plurality of amplified signals;

comparing the amplified signals to a common reference potential;

producing pulses only when the amplified signals are at or above the common reference potential; and repeatedly delaying the corresponding pulses by a common delay period.

23. The method of claim 19, wherein the step of amplifying the signal in a plurality of amplification stages includes the step of successively amplifying the signal through a plurality of amplification stages.

24. The method of claim 23, wherein the step of successively amplifying the signal through the plurality of amplification stages includes the step of amplifying the signal through each of the plurality of amplification stages at a common gain.

25. The method of claim 23, wherein the step of successively amplifying the signal through the plurality of amplification stages includes the step of amplifying the signal through each of the plurality of amplification stages at the gain greater than unity.

26. The method of claim 23, wherein the step of successively amplifying the signal through the plurality of amplification stages includes the step of amplifying the signal through each of the plurality of amplification stages each having a gain less than that of a subsequent stage.

27. The method of claim 17, further comprising the step of detecting a prescribed characteristic in the corresponding pulses.

28. The method of claim 27, wherein the step of detecting a prescribed characteristic in the corresponding pulses includes the step of detecting edges in the corresponding pulses.

* * * * *